(12) United States Patent
Minamisawa et al.

(10) Patent No.: US 6,282,102 B1
(45) Date of Patent: Aug. 28, 2001

(54) DRIVE CIRCUIT FOR SWITCHING POWER SUPPLY

(75) Inventors: Toshitaka Minamisawa; Atsushi Matsuzaka, both of Nagano (JP)

(73) Assignee: Nagano Japan Radio Co., Ltd., Nagano (JP)

( * ) Notice: Subject to any disclaimer, the term of this patent is extended or adjusted under 35 U.S.C. 154(b) by 0 days.

(21) Appl. No.: 09/508,100

(22) PCT Filed: Aug. 26, 1999

(86) PCT No.: PCT/JP99/04596

§ 371 Date: May 16, 2000

§ 102(e) Date: May 16, 2000

(87) PCT Pub. No.: WO00/13301

PCT Pub. Date: Mar. 9, 2000

(30) Foreign Application Priority Data

Aug. 28, 1998 (JP) .................................................. 10-243030

(51) Int. Cl.⁷ .................................................. H02M 3/335
(52) U.S. Cl. .............................................. 363/16; 363/131
(58) Field of Search ................................. 363/16, 17, 15, 363/95, 98, 131, 132

(56) References Cited

U.S. PATENT DOCUMENTS

| 5,168,182 | 12/1992 | Salerno et al. . |
| 5,418,702 | * 5/1995 | Marinus et al. ...................... 363/16 |
| 5,691,890 | * 11/1997 | Hyde .................................... 363/89 |
| 5,969,954 | * 10/1999 | Zaitsu .................................. 363/16 |
| 5,991,166 | * 11/1999 | Kalfhaus ............................. 363/16 |
| 6,018,467 | * 1/2000 | Majid et al. ........................ 363/16 |

FOREIGN PATENT DOCUMENTS

| 7-500720 | 1/1995 | (JP) . |
| 8-186981 | 7/1996 | (JP) . |

* cited by examiner

*Primary Examiner*—Adolf Deneke Berhana
(74) *Attorney, Agent, or Firm*—Greenblum & Bernstein, P.L.C.

(57) ABSTRACT

A drive circuit for a switching power supply includes a driving element (11, 12) for generating a drive signal (SD), and a transformer (15) for outputting the drive signal input via a capacitive element to a primary winding (15a) thereof (14), to a main switching element (21) from a secondary winding (15b) thereof. The drive circuit (3) is constructed such that breakage of the main switching element (21) can be prevented while permitting an increase in the range of switching control. The drive circuit (3) is characterized by comprising an inductive element (16) having an inductance value smaller than at least a value of an excitation inductance of the primary winding (15a) and allowing series resonance to be produced between the capacitive element (14) and the inductive element (16).

12 Claims, 4 Drawing Sheets

DRIVE CIRCUIT FOR SWITCHING POWER SUPPLY

TECHNICAL FIELD

This invention relates to a drive circuit for a switching power supply, and more particularly to a drive circuit for a switching power supply, for delivering a drive signal to a main switching element via a drive transformer.

BACKGROUND ART

Conventionally, a power supply unit 41 shown in FIG. 6 is well known as a switching power supply unit including a drive circuit of the above-mentioned kind. The power supply unit 41 is comprised of a control circuit 2 for generating a switching signal SS, a drive circuit 42 for carrying out power amplification of the switching signal SS, and a main circuit 4 for generating a DC voltage Vo by performing switching operation in synchronism with a drive signal SD delivered from the drive circuit 42.

The drive circuit 42 is comprised of a pair of an npn transistor 11 and a pnp transistor 12 forming a complementary circuit, a pull-up resistor 13, a capacitor 14 for blocking DC current, and a drive transformer 15 having a primary winding 15a and a secondary winding 15b at a turns ratio of 1:1. Further, the main circuit 4 is comprised of an n-channel MOS FET 21 serving as a main switching element, bias resistors 22 and 23, a switching transformer 24, and a rectifying and smoothing circuit 25.

In the power supply unit 41, the control circuit 2 receives a feedback signal SF delivered from the main circuit 4, and outputs a switching signal SS having a pulse width (or frequency) dependent on the feedback signal SF. Then, the transistors 11 and 12 operate alternately in synchronism with the switching signal SS delivered from the control circuit 2, to carry out the power amplification of the switching signal SS for generation of the drive signal SD, and delivers the generated drive signal SD to the primary winding 15a of the transformer 15 via the capacitor 14. As a result, the drive signal SD is induced in the secondary winding 15b of the transformer 15 and supplied to the FET 21. In this case, if the duty ratio of the switching signal SS is 50%, the FET 21 has a voltage VGS of VCC/2 between its gate and source during the ON time period TON of the switching signal SS, as shown in FIG. 5, and a voltage VGS of –VCC/2 during an OFF time period TOFF of the same. As a result, during the ON time period TON over which the voltage VGS is above a threshold voltage Vth, the FET 21 is controlled to an ON state to output a drain current ID shown in the figure to the primary winding 24a of the transformer 24. Then, the rectifying and smoothing circuit 25 rectifies and smoothes a voltage induced in the secondary winding 24b of the transformer 24, to thereby generate a DC voltage Vo.

DISCLOSURE OF INVENTION

From a study of the above prior art, the inventor found out the following problems. In the conventional power supply unit 41, if the duty ratio of the switching signal SS is e.g. 50%, the FET 21 has the voltage of ±VCC/2 applied between the gate and source thereof during operation of the control circuit 2. Accordingly, since the transformer has the turns ratio of 1:1, the voltage of VCC/2 is constantly applied between opposite ends of the capacitor 14. This means that the capacitor 14 constantly stores energy. For this reason, when the control circuit 2 stops operating, the stored energy is released from the capacitor 14, whereby a series resonance phenomenon dependent on a capacitance of the capacitor 14 and an excitation inductance of the primary winding 15a of the transformer 15 occurs in a closed circuit formed by the capacitor 14, the primary winding 15a, and the emitter and collector of the transistor 12. In this case, if the capacitance of the capacitor 14 is represented by a value C and the excitation inductance of the primary winding 15a by a value L, a series resonance frequency f in the series resonance phenomenon is expressed by the following formula (1):

$$f=1/(2 \cdot \pi \cdot (L \cdot C)^{0.5}) \qquad (1)$$

Therefore, during production of the series resonance, a series resonance voltage having a voltage waveform W11 is induced in the secondary winding 15b of the transformer 15, and the voltage waveform W11 is applied between the gate and source of the FET 21. In this case, since the excitation inductance of the primary winding 15a is large, the series resonance frequency f provides a period which is extremely longer than a period (TS) of the switching signal SS. For this reason, during time periods between times t11 and t12 and between times t13 and t14, over each of which the voltage waveform W11 is above the threshold voltage Vth, an excessively large amount of drain current ID flows to the FET 21 as shown by respective current waveforms W12 and W13. As a result, magnetic saturation occurs in the transformer 24, which, for instance, causes a further excessively large amount of drain current ID to flow, setting up a vicious circle. Thus, the conventional power supply unit 41 suffers from a problem that the FET 21 and the transformer 24 can be broken due to the series resonance phenomenon which occurs when the control circuit 2 stops operating. To avoid this vicious circle, the conventional power supply unit 41 controls the duty ratio of the switching signal SS within a range below 50% to reduce the energy stored in the capacitor 14 to thereby reduce resonance energy during production of the series resonance. For this reason, the conventional power supply unit 41 is not allowed to control the duty ratio of the switching signal SS to 50% or more, and hence the range of switching control is narrow.

The invention has been made to solve the above problems, and it is a main object of the invention to provide a drive circuit for a switching power supply, which is capable of preventing breakage of a main switching element and at the same time permits an increase in the range of switching control.

The drive circuit for a switching power supply includes a driving element for generating a drive signal for driving a main switching element, and a transformer for delivering the drive signal input via a capacitive element to a primary winding thereof, to the main switching element from a secondary winding thereof, the drive circuit being characterized by comprising an inductive element having an inductance value smaller than at least a value of an excitation inductance of the primary winding and allowing series resonance to be produced between the capacitive element and the inductive element.

This drive circuit increases the resonance frequency in the resonance phenomenon caused by the capacitive element and the inductive element upon stoppage of operation for generating power. Therefore, since the period of the series resonance frequency is shortened, a time period over which the resonance voltage waveform is above a threshold voltage of the switching element becomes shorter. For this reason, the switching element becomes difficult to turn on, and even when the switching element is turned on, the maximum value of a current flowing is reduced, whereby magnetic saturation of the switching transformer connected to the main switching element is prevented and hence breakage of the main switching element and the switching transformer is prevented. Further, by setting a capacitance value of the capacitive element to a suitable value, it is possible to minimize the amount of energy stored in the capacitive element. In this case, series resonance energy itself is reduced, which ensures prevention of the magnetic saturation of the switching transformer. As a result, the duty ratio of the drive signal can be increased, whereby it is also possible to increase the range of switching control.

Preferably, the capacitive element and the inductive element have respective element constants that determine a resonance frequency exceeding one fifth of a frequency of the drive signal. By this construction, the ON time period of the switching element is further shortened. In this case, since the magnetic saturation of the switching transformer is reliably prevented, it is possible to ensure prevention of the breakage of the main switching element and the switching transformer.

Further preferably, the capacitive element and the inductive element have respective element constants that cause the resonance frequency to exceed the frequency of the drive signal. By this construction, the ON time period of the switching element is further shortened, and hence the magnetic saturation of the switching transformer is reliably prevented, whereby it is possible to more positively prevent the breakage of the main switching element and the switching transformer.

Further, the inductive element can be connected in parallel with the primary winding. Furthermore, a series circuit formed by the inductive element and a damper resistor can be connected in parallel with the primary winding. In the case of the series circuit being connected in parallel with the primary winding, energy generated during the series resonance phenomenon caused by the capacitive element and the inductive element is lost at the damper resistor. Therefore, the resonance phenomenon is quickly controlled, which makes it possible to more positively prevent the breakage of the main switching element and the switching transformer.

BEST MODE OF CARRYING OUT THE INVENTION

The invention will now be described in detail with reference to the drawings showing preferred embodiments thereof. In these embodiment, a drive circuit for a switching power supply, according to the invention, is applied to a switching power supply unit.

(First Embodiment)

Figure 1:
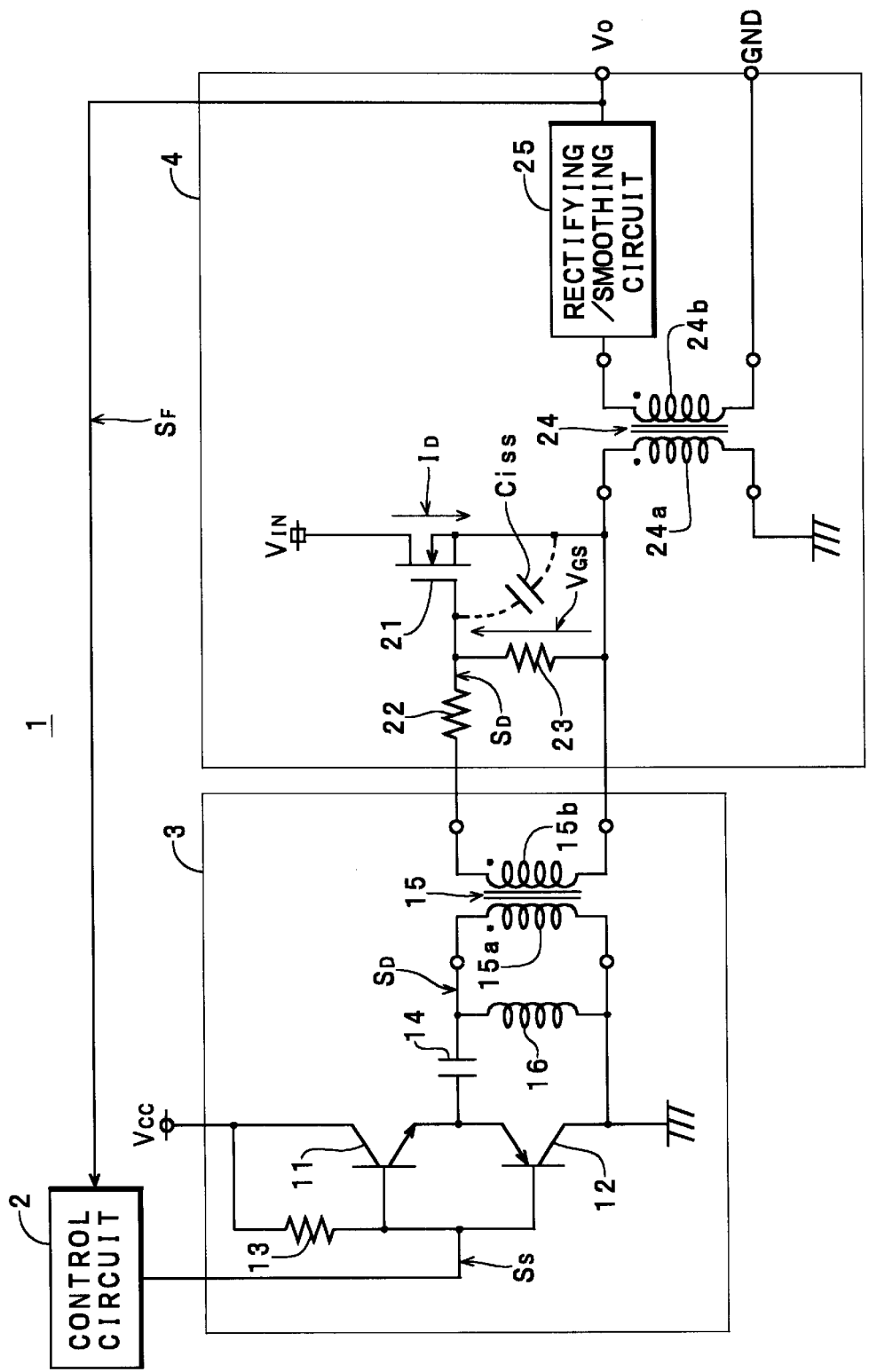
FIG. 1 is a circuit diagram of a power supply unit 1 according to a first embodiment of the invention.

Referring first to FIG. 1, there is shown the circuitry of a power supply unit 1. The power supply unit 1 includes a control circuit 2 for generating a switching signal SS, a drive circuit 3, and a main circuit 4. The drive circuit 3 is comprised of a pair of an npn transistor 11 and a pnp transistor 12, which forms a complementary circuit, a pull-up resistor 13, a capacitor 14 corresponding to a capacitive element of the invention for blocking a DC current, a drive transformer 15 having a primary winding 15a and a secondary winding 15b at a turns ratio of 1:1, and an inductor 16 connected in parallel with the primary winding 15a and corresponding to an inductive element of the invention. The main circuit 4 is comprised of an n-channel MOS FET 21, which is a main switching element, bias resistors 22 and 23, a switching transformer 24, and a rectifying and smoothing circuit 25.

In the embodiment, a capacitance value C of the capacitor 14 and an inductance value L16 of the inductor 16 in the drive circuit 3 are defined such that they satisfy the following conditions. That is, first, the capacitance value C of the capacitor 14 is defined within a range shown by the following formula (2) such that the amount of stored energy is minimized when the control circuit 2 stops operating and at the same time, a voltage VGS which is sufficiently higher than a threshold voltage Vth can be supplied between the gate and source of the FET 21, which corresponds to the main switching element of the invention:

$$20 \cdot Ciss \leq C \leq 100 \cdot Ciss \qquad (2)$$

where Ciss represents an input capacitance of the FET 21.

Further, after the capacitance value C of the capacitor 14 is set to a predetermined value within the range described above, the inductance value L16 is defined according to the following formula (3) such that an ON time period TON of the FET 21 energized due to series resonance becomes equal to or shorter than 50% of a period TS of the switching signal SS. The inductance value L16 defined according to the formula (3) assumes a value which is sufficiently smaller than an excitation inductance value L of the primary winding 15a. More specifically, if the excitation inductance value L of the primary winding 15a is 1 mH, for instance, the inductance value L16 of the inductor 16 is equal to approximately 10 μH. In the formula (3), the value fSW represents a frequency of the switching signal SS.

$$2 \cdot \pi \cdot (L16 \cdot C)^{0.5} \leq 1/fSW \qquad (3)$$

However, it was demonstrated by the inventor's experiment that it is possible to prevent overcurrent from braking the FET 21 and the transformer 24, by setting the inductance value L16 within a range defined by the following formula (4). In the following, an example of the inductance value L16 defined according to the formula (4) will be described.

$$2 \cdot \pi \cdot (L16 \cdot C)^{0.5} \leq 5/fSW \qquad (4)$$

Next, the rationale of the above formula (4) will be described. The formula (4) means that it is required to set a resonance period of the series resonance caused by the inductor 16 and the capacitor 14 such that it is equal to or shorter than a time period which is five times as long as the period TS of the switching signal SS. On the other hand, a magnetic flux density of the transformer 15 is increased with an increase of the ON time period (i.e. the period TS) of the switching signal SS. Further, although a saturation magnetic flux density of a ferrite core used in the transformer 15 is generally equal to 5000 gauss at the maximum, in the power supply unit in actual use, the magnetic flux density actually operating during normal switching operation performed in response to the switching signal SS is defined to be held at a value which is equal to or smaller than 1000 gauss. For this reason, by setting the resonance period of the series resonance such that it is equal to or shorter than the time period which is five times as long as the period TS of the switching signal SS, it is possible to control the magnetic flux density of the transformer 15 during production of the series resonance within the maximum value of five times larger than the operating magnetic flux density. Therefore, even during occurrence of the series resonance phenomenon, the transformer can be operated with its magnetic flux density held at a level equal to or below 5000 gauss, which ensures prevention of magnetic saturation. The above is the rationale of the formula (4).

Next, description will be made of the operation of the power supply unit 1, particularly when the control circuit 2 stops operating, with reference to FIG. 2.

When the switching signal SS having a pulse width (or frequency) dependent on the feedback signal SF output from the main circuit 4 is delivered from the control circuit 2, the transistors 11 and 12 operate alternately in synchronism with the switching signal SS to carry out power amplification of the switching signal SS to thereby generate the drive signal SD. The drive signal SD is output to the primary winding 15a of the transformer 15 via the capacitor 14 and thereby induced in the secondary winding 15b. Then, the induced drive signal SD is supplied to the gate of the FET 21. In this case, as shown in FIG. 2, if the duty ratio of the switching signal SS is 50%, for instance, the FET 21 has a voltage VGS of VCC/2 between its gate and source during the ON time period TON of the switching signal SS, and a voltage VGS of −VCC/2 during the OFF time period TOFF of the same. As a result, during the ON time period TON over which the voltage VGS is above the threshold voltage Vth, the FET 21 is controlled to the ON state, to output a drain current ID shown in the figure to the primary winding 24a of the transformer 24. Then, the rectifying and smoothing circuit 25 rectifies and smoothes the voltage induced in the secondary winding 24b of the transformer 24, to thereby generate a DC voltage Vo.

On the other hand, when the control circuit 2 stops operating, the series resonance phenomenon occurs in the closed circuit formed by the capacitor 14, the parallel circuit formed by the primary winding 15a and the inductor 16, and the emitter and collector of the transistor 12. In this case, since the excitation inductance value L of the primary winding 15a is sufficiently small and negligible compared with the inductance value L16 of the inductor 16, the series resonance frequency is determined based on the capacitance of the capacitor 14 and the inductance value L16 of the inductor 16. The series resonance frequency f1 is expressed by the following formula (5):

$$f1 = 1/(2 \cdot \pi \cdot (L16 \cdot C)^{0.5}) \quad (5)$$

Figure 2:
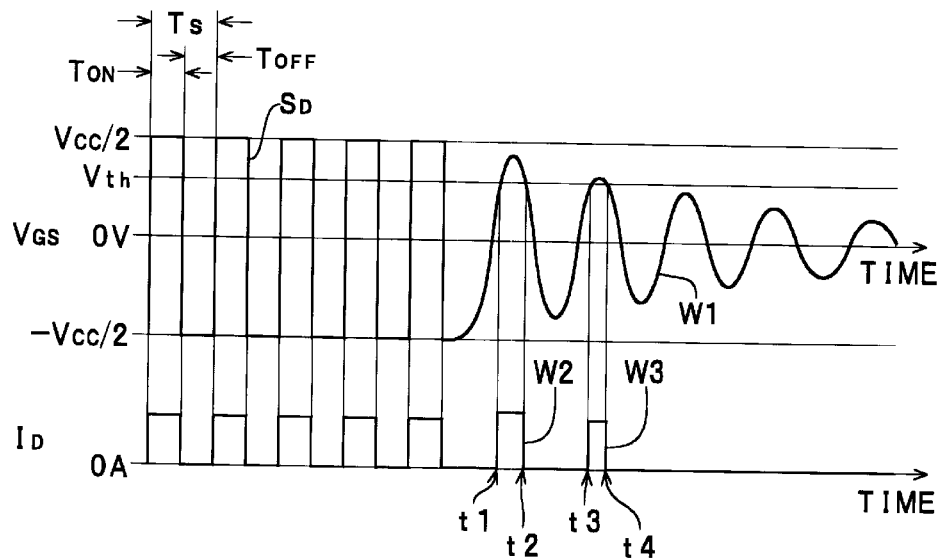
FIG. 2 is a diagram which is useful in explaining operation of the power supply unit 1 according to the first embodiment and shows a voltage waveform of a voltage VGS between the gate and source of an FET 21 as well as a current waveform of a drain current ID flowing through the FET 21.

During production of the series resonance, a series resonance voltage having a voltage waveform W1 shown in FIG. 2 is induced in the secondary winding 15b of the transformer 15, and the voltage waveform W1 is applied between the gate and source of the FET 21. In this case, the period of the series resonance frequency f1 is within a range of one to five times as long as the period TS of the switching signal SS, so that time periods between times t1 and t2 and between times t3 and t4, over each of which the voltage waveform W1 is above the threshold voltage Vth, are each sufficiently shorter than the time periods between the times t11 and t12 and between the times t13 and t14 during the series resonance in the conventional power supply unit 41. Therefore, as shown by waveforms W2 and W3 in the figure, the maximum value of the drain current ID flowing through the FET 21 during the time periods between the times t1 and t2 and between the times t3 and t4 becomes slightly larger than that of the drain current ID in normal switching operation, whereby excessive conduction of the drain current ID is prevented.

As described above, according to the power supply unit 1, since the period of the series resonance produced when the control circuit 2 stops operating can be controlled within a time period five times longer than the period of the switching signal SS (preferably, it is shorter than the period of the switching signal SS), it is also possible to prevent excessive conduction of the drain current ID. As a result, the magnetic saturation of the transformer 24 can be prevented reliably, whereby it is possible to prevent breakage of the FET 21 and the transformer 24 caused by the series resonance phenomenon. It should be noted that if the period of the series resonance frequency f1 is controlled to a shorter period than the period TS of the switching signal SS, the time period over which the resonance voltage waveform is above the threshold voltage vth can be shortened. As a result, the FET 21 becomes difficult to turn on, and even when it is turned on, the maximum value of the drain current ID flowing through the FET 21 becomes smaller. Therefore, it is possible to prevent the magnetic saturation of the transformer 24 and the breakage of the FET 21 and the transformer 24 caused by the series resonance phenomenon more reliably.

Further, by setting the capacitance value C of the capacitor 14 to a suitable value to minimize the amount of stored energy of the capacitor 14 when the control circuit 2 stops operating, it is possible to reduce the series resonance energy itself, whereby the breakage of the FET 21 and the transformer 24 are positively prevented. Thus, differently from the conventional power supply unit 41, the duty ratio of the switching signal SS can be controlled to 50% or more, so that the range of switching control can be increased.

(Second Embodiment)

Figure 3:
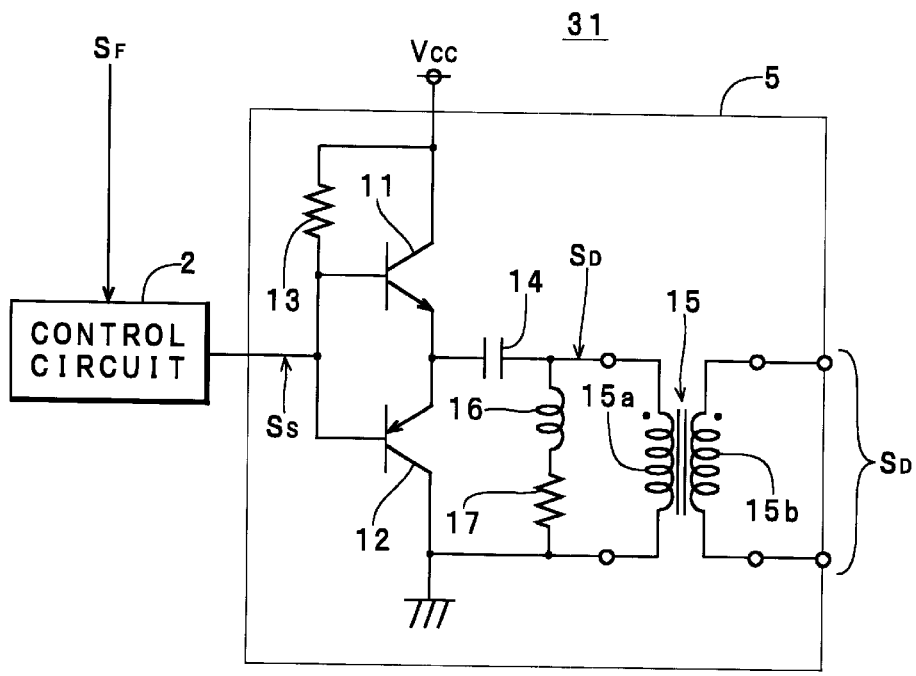
FIG. 3 is a circuit diagram of a power supply unit 31 according to a second embodiment of the invention.

Next, description will be made of circuitry and operation of the power supply unit 31 which is formed by modifying part of the power supply unit 1, with reference to FIG. 3. Components corresponding to those of the first embodiment are indicated by identical reference numerals, and detailed description thereof will be omitted.

As shown in the figure, the power supply unit 31 is distinguished from the power supply unit 1 in that it has a drive circuit 5 in which a series circuit formed by an inductor 16 and a damper resistor 17 is connected in parallel with a primary winding 15a of the transformer 15.

Figure 4:
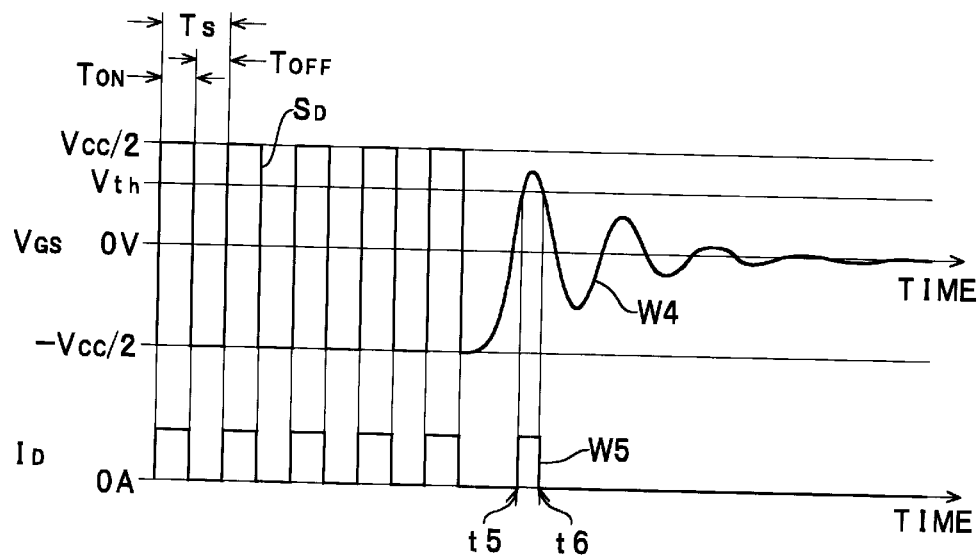
FIG. 4 is a diagram which is useful in explaining operation of the power supply unit 31 according to the second embodiment and shows a voltage waveform of a voltage VGS between the gate and source of an FET 21 as well as a current waveform of a drain current ID flowing through the FET 21.
Figure 5:
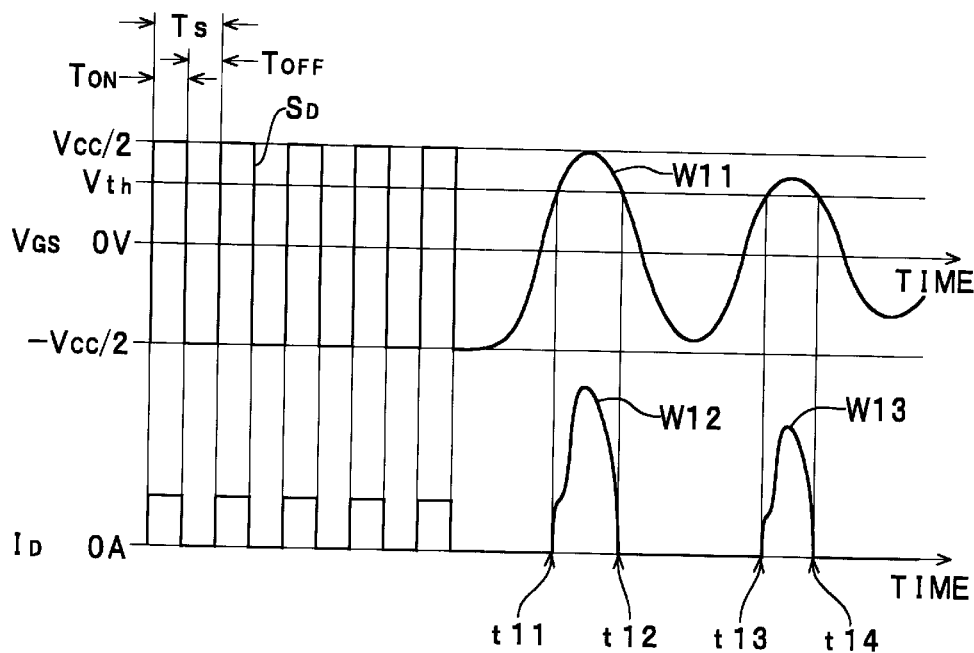
FIG. 5 is a diagram which is useful in explaining operation of a conventional power supply unit 41 and shows a voltage waveform of a voltage VGS between the gate and source of an FET 21 as well as a current waveform of a drain current ID flowing through the FET 21.
Figure 6:
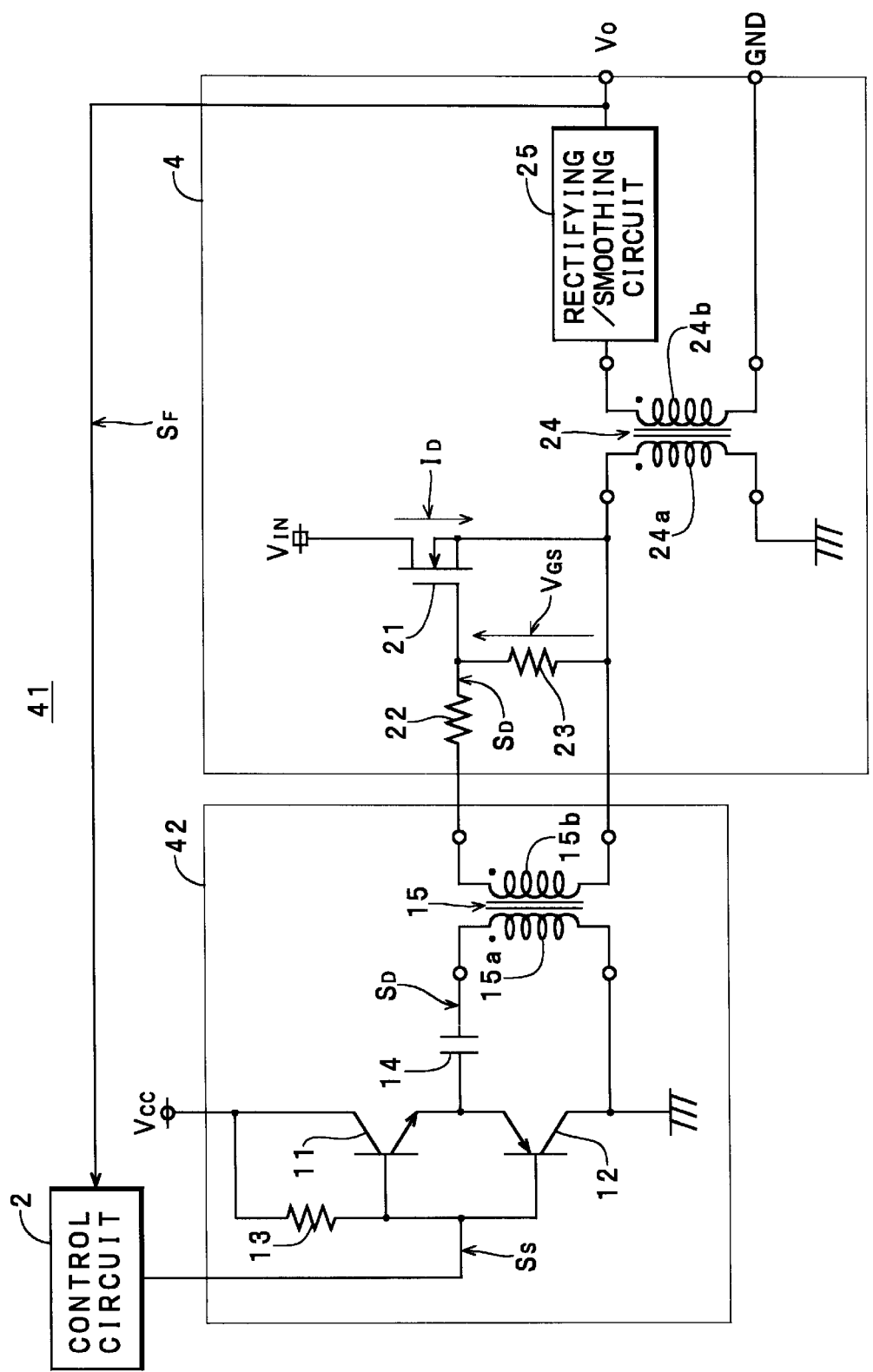
FIG. 6 is a circuit diagram of the conventional power supply unit 41.

When a control circuit 2 stops operating, a series resonance phenomenon occurs in a closed circuit formed by a capacitor 14, a parallel circuit formed by the series circuit of the inductor 16 and the resistor 17 and the primary winding 15a, and the emitter and collector of a transistor 12. In this case, energy stored in the capacitor 14 is lost at the resistor 17 during production of series resonance. For this reason, as shown in FIG. 4, a voltage waveform W4 of a voltage VGS applied between the gate and source of an FET 21 during production of the series resonance has a characteristic of being attenuated more rapidly than the voltage waveform W1 in the case of the power supply unit 1, though the period is identical between the two waveforms. Accordingly, the voltage waveform W4 does not exceed a threshold value Vth except during a time period between times t5 and t6, which is even shorter than the time period between the times t1 and t2, i.e. the time period during production of series resonance in the unit 1. Therefore, the FET 21 becomes difficult to turn on between the times t5 and t6, and as shown by a waveforms W5 in the figure, the maximum value of a drain current ID flowing through the FET 21 during the time period becomes substantially equal to or slightly smaller than that of the drain current ID in normal switching operation. As a result, excessive conduction of the drain current ID is prevented reliably.

As described above, according to the power supply unit 31, since the series circuit formed by the inductor 16 and the resistor 17 is connected in parallel with the primary winding 15a, it is possible to control the resonance phenomenon quickly and hence further reduce the drain current ID flowing through the FET 21 during production of the series resonance. This more reliably prevents magnetic saturation of the transformer 24, which ensures more positive prevention of breakage of the FET 21 and the transformer 24 caused by the series resonance phenomenon.

It should be noted that the present invention is not limited to the above embodiments, but the construction thereof can be modified as required. For instance, although in each of the power supply units 1 and 31 according to the embodiments of the invention, the FET is used as the main switching element of the invention, this is not limitative, but it is possible to employ various kinds of switching elements such as transistors. Further, as for the points of connection of the inductive element and the damper resistor according to the invention are concerned, so long as they are connected in parallel with the primary winding of the transformer in an equivalent manner, sufficient effects can be obtained. Moreover, the driving element according to the invention is not limited to the complementary circuit, but it is possible to employ a push-pull circuit or an SEPP (Single Ended Push-Pull) circuit.

INDUSTRIAL APPLICABILITY

As described above, the drive circuit for a switching power supply, according to the invention, includes the inductive element having an inductance value smaller than at least a value of an excitation inductance of the primary winding and allowing series resonance to occur between the capacitive element and the inductive element itself, so that the resonance frequency of the resonance phenomenon caused by the capacitive element and the inductive element upon stoppage of operation for generating power is increased. As a result, it is possible to reduce the ON time period of the main switching element, whereby the drive circuit for a switching power supply can be realized which is capable of preventing breakage of the main switching element and the switching transformer connected thereto. Further, since it is possible to increase the duty ratio of the drive signal, the drive circuit is realized which permits an increase in the range of switching control.

What is claimed is:

1. A drive circuit for a switching power supply, comprising the drive circuit and a main switching element, the drive circuit comprising:

a driving element that generates a drive signal for driving said main switching element;

a capacitive element;

a transformer having a primary winding and a secondary winding, said primary winding being connected to said driving element via said capacitive element, said primary winding receiving said drive signal, said secondary winding delivering said drive signal to said main switching element; and an inductive element connected in series with said capacitive element, said inductive element having an inductance value smaller than a value of an excitation inductance of said primary winding and allowing series resonance to be produced between said capacitive element and said inductive element.

2. The drive circuit according to claim 1, wherein said capacitive element and said inductive element have respective element constants that cause said series resonance to have a resonance frequency exceeding one fifth of a frequency of said drive signal.

3. The drive circuit according to claim 1, wherein said capacitive element and said inductive element have said respective element constants that cause said series resonance to have a resonance frequency exceeding a frequency of said drive signal.

4. The drive circuit according to claim 1, wherein said inductive element is connected in parallel with said primary winding.

5. The drive circuit according to claim 1, wherein a series circuit is connected in parallel with said primary winding, said series circuit being formed by said inductive element and a damper resistor.

6. The drive circuit according to claim 2, wherein said inductive element is connected in parallel with said primary winding.

7. The drive circuit according to claim 2, wherein a series circuit is connected in parallel with said primary winding, said series circuit being formed by said inductive element and a damper resistor.

8. The drive circuit according to claim 3, wherein said inductive element is connected in parallel with said primary winding.

9. The drive circuit according to claim 3, wherein a series circuit is connected in parallel with said primary winding, said series circuit being formed by said inductive element and a damper resistor.

10. The drive circuit according to claim 1, wherein said switching power supply further comprises a control circuit that generates a switching signal dependent on a feedback signal based on an output from said main switching element, and applies said switching signal to said driving element;

said driving element generating said drive signal in synchronism with said switching signal; and said capacitive element comprising a capacitor having a capacitance value as an element constant, and said capacitance value satisfying the following relationship:

$$20 \cdot Ciss \leq C \leq 100 \cdot Ciss$$

wherein C represents said capacitance value, and Ciss represents an input capacitance of said main switching element; and said inductive element comprising an inductor having said inductance value as an element constant, and said inductance value satisfying the following relationship:

$$2 \cdot \pi \cdot (L \cdot C)^{0.5} \leq 5/fSW$$

wherein L represents said inductance value, and fSW represents a frequency of said driving element.

11. The drive circuit according to claim 1, wherein said switching power supply further comprises a control circuit that generates a switching signal dependent on a feedback signal based on an output from said main switching element, and applies said switching signal to said driving element;

said driving element generating said drive signal in synchronism with said switching signal; and said capacitive element comprising a capacitor having a capacitance value as an element constant, and said capacitance value satisfying the following relationship:

$$20 \cdot C_{iss} \leq C \leq 100 \cdot C_{iss}$$

wherein C represents said capacitance value, and $C_{iss}$ represents an input capacitance of said main switching element; and said inductive element comprising an inductor having said inductance value as an element constant, and said inductance value satisfying the following relationship:

$$2 \cdot \pi \cdot (L \cdot C)^{0.5} \leq 5/fSW$$

wherein L represents said inductance value, and fSW represents a frequency of said driving element.

12. The drive circuit according to claim 1, wherein said driving element comprises a complementary circuit formed of a npn transistor and a pnp transistor, and wherein said main switching element comprises an n-channel MOS FET.

* * * * *